US007061411B2

(12) United States Patent
Hung

(10) Patent No.: US 7,061,411 B2
(45) Date of Patent: Jun. 13, 2006

(54) DEVICE AND METHOD FOR ENHANCING RESOLUTION OF DIGITAL ENCODER

(75) Inventor: Hao-Feng Hung, Taoyuan (TW)

(73) Assignee: Benq Corporation, Taoyuan (TW)

( * ) Notice: Subject to any disclaimer, the term of this patent is extended or adjusted under 35 U.S.C. 154(b) by 0 days.

(21) Appl. No.: 11/145,570

(22) Filed: Jun. 3, 2005

(65) Prior Publication Data

US 2005/0280562 A1 Dec. 22, 2005

(30) Foreign Application Priority Data

Jun. 16, 2004 (TW) .............................. 93117373 A

(51) Int. Cl.
*H03M 1/48* (2006.01)

(52) U.S. Cl. ........................ 341/114; 341/111; 341/115

(58) Field of Classification Search ........ 341/111–117; 382/291, 236; 710/127
See application file for complete search history.

(56) References Cited

U.S. PATENT DOCUMENTS 5,463,393 A * 10/1995 Havlicsek ................... 341/115
5,969,659 A * 10/1999 Balch et al. ................ 341/159
6,188,341 B1 * 2/2001 Taniguchi et al. .......... 341/111
6,317,071 B1 * 11/2001 Kolsrud et al. ............ 341/115
6,556,153 B1 * 4/2003 Cardamone ................. 341/111
6,590,513 B1 * 7/2003 Stetson et al. .............. 341/143
6,654,508 B1 * 11/2003 Markham ................... 382/291
6,801,150 B1 * 10/2004 Honda ........................ 341/161

* cited by examiner

*Primary Examiner*—Howard L. Williams
*Assistant Examiner*—Lam T. Mai
(74) *Attorney, Agent, or Firm*—Ladas & Parry LLP

(57) ABSTRACT

The present invention provides a device and a method for enhancing the resolution of the digital signal of a digital encoder. The device comprises a digital encoder which outputs a fundamental position signal. Beside, the device comprises a selected integral circuit which receives the fundamental position signal to produce an integral signal according to a predetermined way, a reset circuit which resets the select integral circuit according to the fundamental position signal, a level shift and gain circuit which transforms and amplifies the level of the integral signal to produce a processing signal, and an analog-digital converter which receives the processing signal to produce an expanding position signal. In the device, the resolution of the expanding position signal is higher than the resolution of the fundamental position signal, so that it enhances the resolution of the digital signal of the digital encoder.

11 Claims, 5 Drawing Sheets

DEVICE AND METHOD FOR ENHANCING RESOLUTION OF DIGITAL ENCODER

BACKGROUND OF THE INVENTION

1. Field of the invention

This present invention relates to a device and method thereof for enhancing the resolution of a digital encoder.

2. Description of the prior art

In the prior art, the digital encoder coordinates the corresponding code strip of the resolution or coder wheel of the resolution to produce the output waveform of the digital signal.

Please refer to FIG. 1. FIG. 1 is a schematic diagram the output waveform 8 of the digital signal produced by the corresponding encoder strip 6 in the prior art. There are plural sets of alternating black and white patterns on the encoder strip 6 of the prior art. The area with diagonal lines on the encoder strip 6 of FIG. 1 is a black area 7. The encoder strip 6 is a detecting element of light to detect the style of alternating black and white pattern on the encoder strip 6; moreover, the digital encoder produces the corresponding output of the digital signal. When the detecting element detects the black area 7, the digital encoder outputs the low level waveform; in contrast, when the detecting element detects the white area, the digital encoder outputs the high level waveform. The output waveform of the digital encoder is used to control the moving position and velocity of the motor.

In the prior art, the operation of the motor is controlled by digital signals and analog signals. The purpose is to achieve the exact operation of controlling the motor by controlling the resolution of the digital signal and analog signal. Because a digital signal is not a continual signal, the resolution is lower; therefore, the digital signal is used to control the rotation of the motor in positions of bigger scale. Because an analog signal is a continual signal, the resolution is higher. Thus, the analog signal is used to control the rotation of the motor in positions of smaller scale. Through operating digital signals and analog signals together, the prior art can precisely control the operation of the motor. This operating style of using digital signals and the analog signals together in the prior art can be achieved by a special control chip.

The main objective of the present invention is to enhance the resolution of the digital signal and uses only the digital signal to achieve the purpose of precisely controlling the rotational operation of the motor.

SUMMARY OF THE INVENTION

The purpose of the present invention is to provide a device and method thereof which enhance the resolution of the digital encoder.

In another purpose, the present invention provides a device and method for enhancing the resolution of the digital encoder. It can enhance the resolution of the digital signal according to the digital signal of the digital encoder. The invention does not need to use special element or complicated circuit to achieve the function of precisely controlling the exact operation of the motor.

According to a device for enhancing the resolution of the digital encoder of the present invention, the device comprises a digital encoder, a selected integral circuit, a reset circuit, a level shift and gain circuit, and a analog-digital converter.

The digital encoder is used to output a fundamental position signal. The selected integral circuit is used to receive the fundamental position signal and to produce an integral signal according to a predetermined way. The reset circuit is used to reset the selected integral circuit according to the fundamental position signal. The level shift and gain circuit is used to transform and amplify the level of the integral signal generated by the selected integral circuit, so as to further produce a processing signal. The analog-digital converter is used to receive the processing signal to produce an expanding position signal. The resolution of the expanding position signal is higher than the resolution of the fundamental position signal.

In the device for enhancing the resolution of the digital encoder of the present invention, the resolution of the expanding position signal is higher than the resolution of the fundamental position signal. When the device which enhances the resolution of the digital encoder of the invention is applied to control the motor, it controls the rotation of the motor in positions of bigger scale according to the fundamental position signal; moreover, the invention controls the rotation of the motor in positions of smaller scale according to the expanding position signal. Therefore, the function of precisely controlling the motor can be achieved.

The present invention provides the device and the method for enhancing the resolution of a digital encoder. Because it enhances the resolution of the digital signal originally produced by the digital encoder, it allows the application of the digital signal outputted by the digital encoder to not be limited by the original design value of the digital encoder. Compared to the prior art, the invention does not need to use special control chip or complicated circuit to apply the original digital signal outputted by the digital encoder and the digital signal with enhanced resolution.

The advantage and the spirit of the invention may be understood by the following recitations together with the appended drawing.

BRIEF DESCRIPTION OF THE APPENDED DRAWINGS

DETAILED DESCRIPTION OF THE INVENTION

Figure 1:
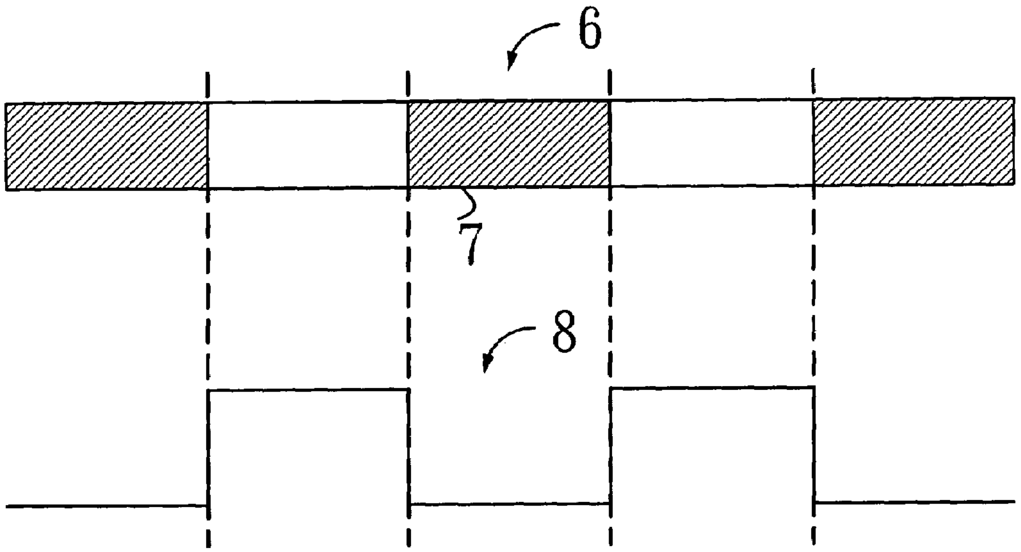
FIG. 1 is a schematic diagram of the output waveform of the digital signal produced by the corresponding encoder strip of the prior art.
Figure 2:
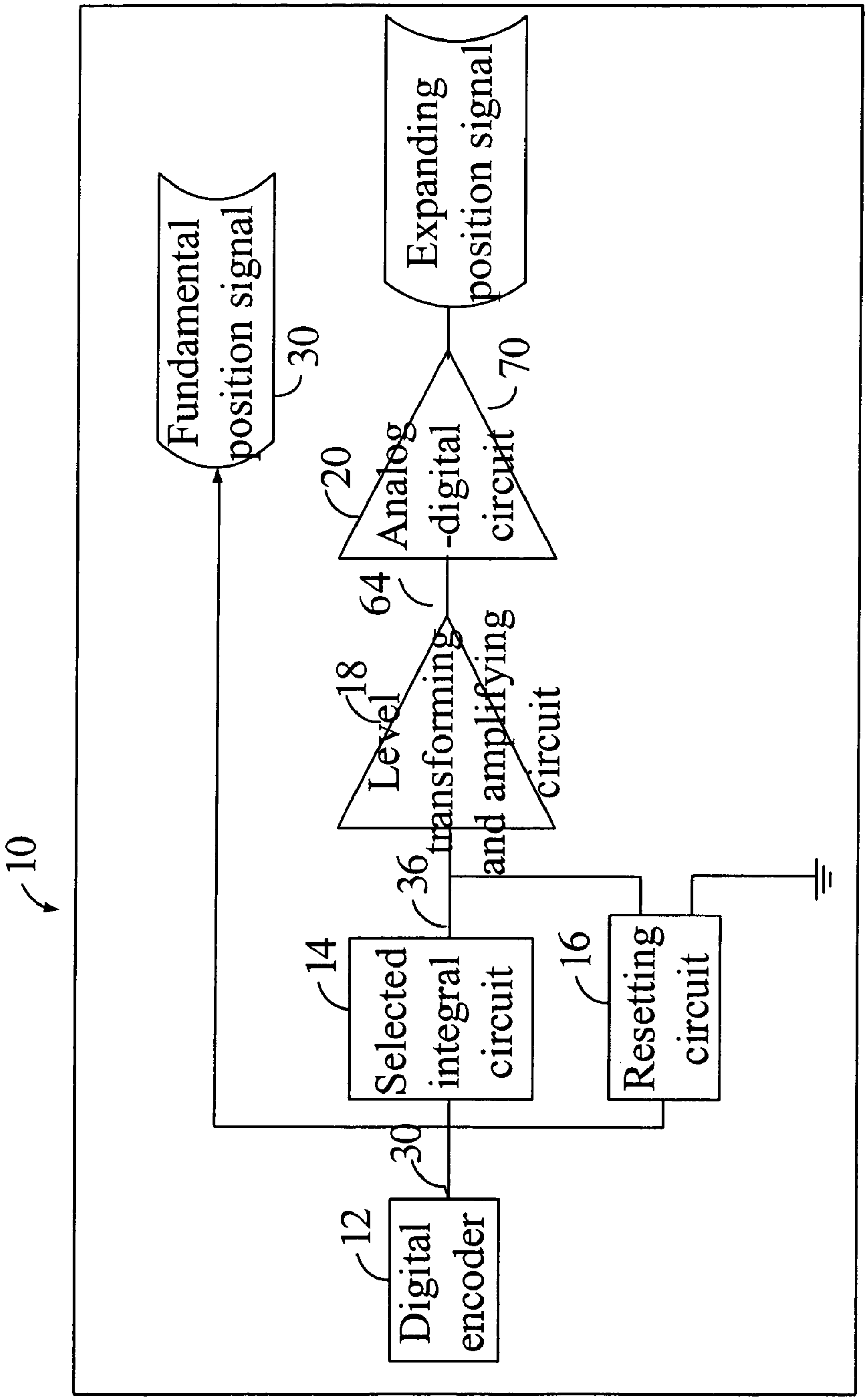
FIG. 2 is a system block diagram of the device for enhancing the resolution of the digital encoder of the present invention.

Please refer to FIG. 2. FIG. 2 is a system block diagram of the device 10 for enhancing the resolution of the digital encoder in the present invention. The device 10 comprises a digital encoder 12, a selected integral circuit 14, a reset circuit 16, a level shift and gain circuit 18, and an analog-digital converter 20. The device 10 is used to enhance the resolution of the digital encoder 12. The digital encoder 12 is used to output a fundamental position signal 30. In this embodiment of the invention, the fundamental position signal 30 is produced corresponding to the style of the coder strip in the digital encoder 12. The fundamental position signal 30 comprises a first phase signal and a second phase signal, and the invention uses the arrangement of the position of the light detecting element in the digital encoder 12 to make the phase difference between the first and the second phase signal to be 90 degree.

In the device 10 for enhancing the resolution of the digital encoder, the selected integral circuit 14 is used to receive the fundamental position signal 30 according to a predetermined way, so as to generate an integral signal. The reset circuit 16 is used to reset the selected circuit 14 according to the fundamental position signal 30. The level shift and gain circuit 18 is used to transform and amplify the level of the integral signal 36 produced by the selected integral circuit 14 to generate a processing signal 64. The analog-digital converter 20 is used to receive the processing signal 64 to produce an expanding position signal 70, and the resolution of the expanding position signal 70 is higher than the resolution of the fundamental position signal 30.

Figure 3:
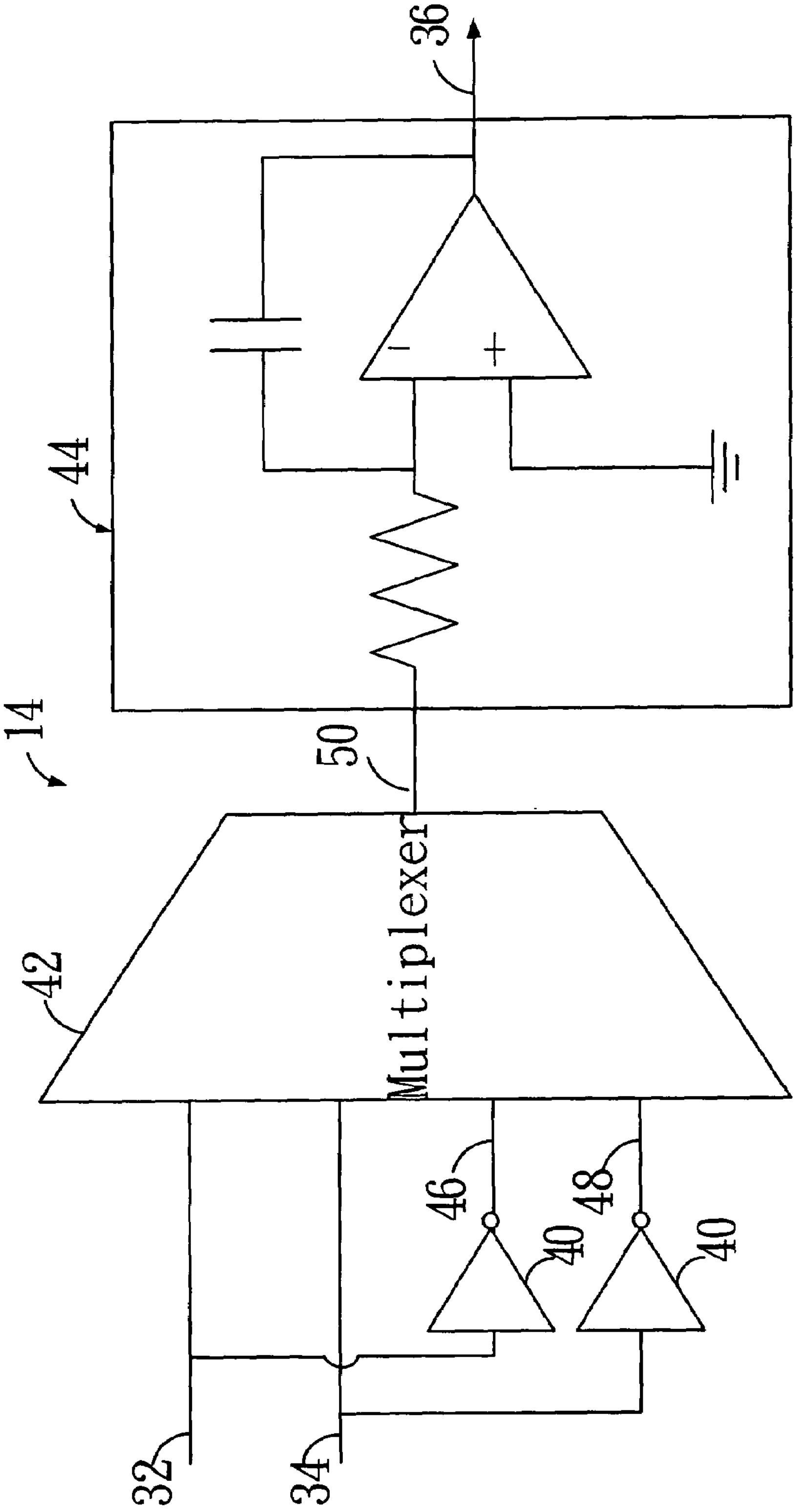
FIG. 3 is a system block diagram of the selected integral circuit of the device for enhancing the resolution of the digital encoder of the present invention.

Please refer to FIG. 3. FIG. 3 is a system block diagram of the selected integral circuit 14 of the device 10 for enhancing the resolution of the digital encoder of FIG. 2. The selected integral circuit 14 comprises an inverter 40, a multiplexer 42, and an inverse integrator 44. The selected integral circuit 14 receives the fundamental position signal 30 which comprises a first phase signal 32 and a second phase signal 34; moreover, the phase difference between the first and the second phase signal is 90 degree. The set of inverter 40 receives the first phase signal 32 and the second phase signal 34 to produce a first inverse signal 46 and a second inverse signal 48. The multiplexer 42 receives the first phase signal 32, the second phase signal 34, the first inverse signal 46, and the second inverse signal 48 to selectively output a selected signal 50, based on a predetermined way. The inverse integrator 44 receives the selected signal 50 outputted by the multiplexer 42 and undergoes integration, so as to produce an integral signal 36.

The following description will illustrate how the selected integral circuit 14 selectively outputs the selected signal 50 according to the predetermined method. The selected signal 50 is the first phase signal 32 if the first phase signal 32 is at the first state, and the second phase signal 34 is at a second state; alternatively, the selected signal 50 is the second phase signal 34 if both the first phase signal 32 and the second phase signal 34 are at the first state. Moreover, the selected signal 50 is the first inverse signal 46 if the first phase signal 32 is at second state and the second phase signal 34 is at the first state; alternatively, the selected signal 50 is the second inverse signal 48 if both the first phase signal 32 and the second phase signal 34 are at second state.

Figure 4:
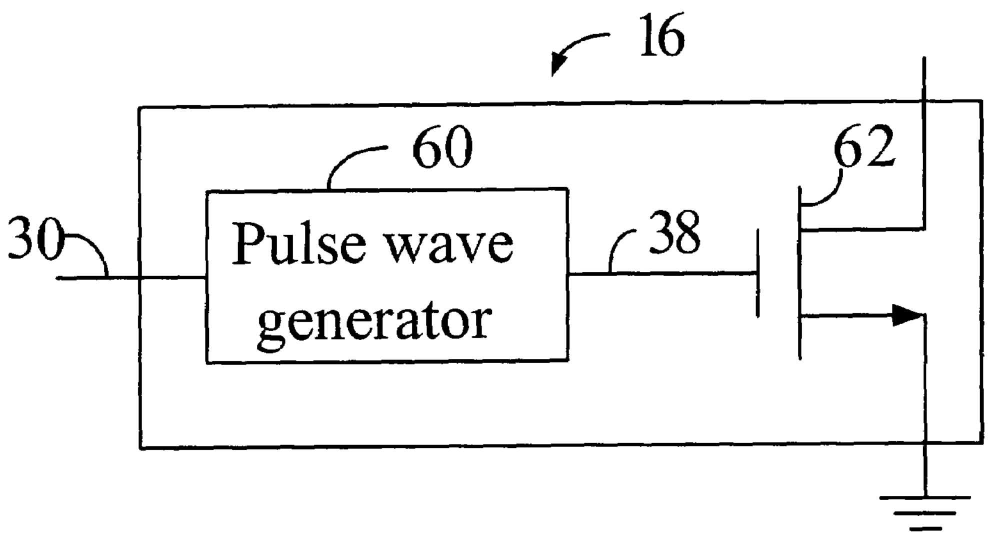
FIG. 4 is system block diagram of the reset circuit of the device for enhancing the resolution of the digital encoder of the present invention.

Please refer to FIG. 4. FIG. 4 is the system block diagram of the reset circuit 16 of the device 10 for enhancing the resolution of the digital encoder of FIG. 2. The reset circuit 16 comprises a pulse wave generator 60 and a switch 62. The pulse wave generator 60 receives the fundamental position signal 30 to produce a reset signal 38. The switch 62 receives the reset signal 38 to reset the selected integral circuit 14. When the reset signal 38 is at the first state, the switch 62 is closed to discharge the integral signal 36 for resetting the selected integral circuit 14.

In the embodiment of the invention, the digital encoder 12 is used to control the motor to rotate, and the resolution of the fundamental position signal 30 is the original design value of the digital encoder 12. By using the device 10 for enhancing the resolution of the digital encoder of the present invention, and through the selected integral circuit 14, the reset circuit 16, the level shift and gain circuit 18, and the analog-digital converter 20, the digital encoder 12 outputs the fundamental position signal 30 to produce the expanding position signal 70; furthermore, the resolution of the expanding position signal 70 is higher than the resolution of the fundamental position signal 30. By utilizing the device 10 of the present invention, the fundamental position signal 30 controls the motor to rotate in bigger scale positions, while the expanding position signal 70 controls the motor to rotate in smaller scale positions. The expanding position signal 70 is usually used when the motor is to stop. In order to control the motor to stop precisely at the correct position, the resolution of the expanding position signal must be high to control the motor, so as to further achieve the function of precisely controlling the motor.

In another embodiment of the invention, the resolution of the digital encoder 12 is 200 LPI (line per inch). On the corresponding encoder strip or encoder wheel, the line pair number of alternating black and white of every inch is 200 pairs. If every changed phase of the digital encoder is four times of the resolution, every inch has 800 changed positions (200*4=800). In this embodiment of the invention, the analog-digital converter 20 can select 8 bit, so that it can achieve a maximum of 204,800 changed positions in every inch in the digital encoder of 200 LPI, thus achieving the purpose of enhancing the resolution.

Figure 5:
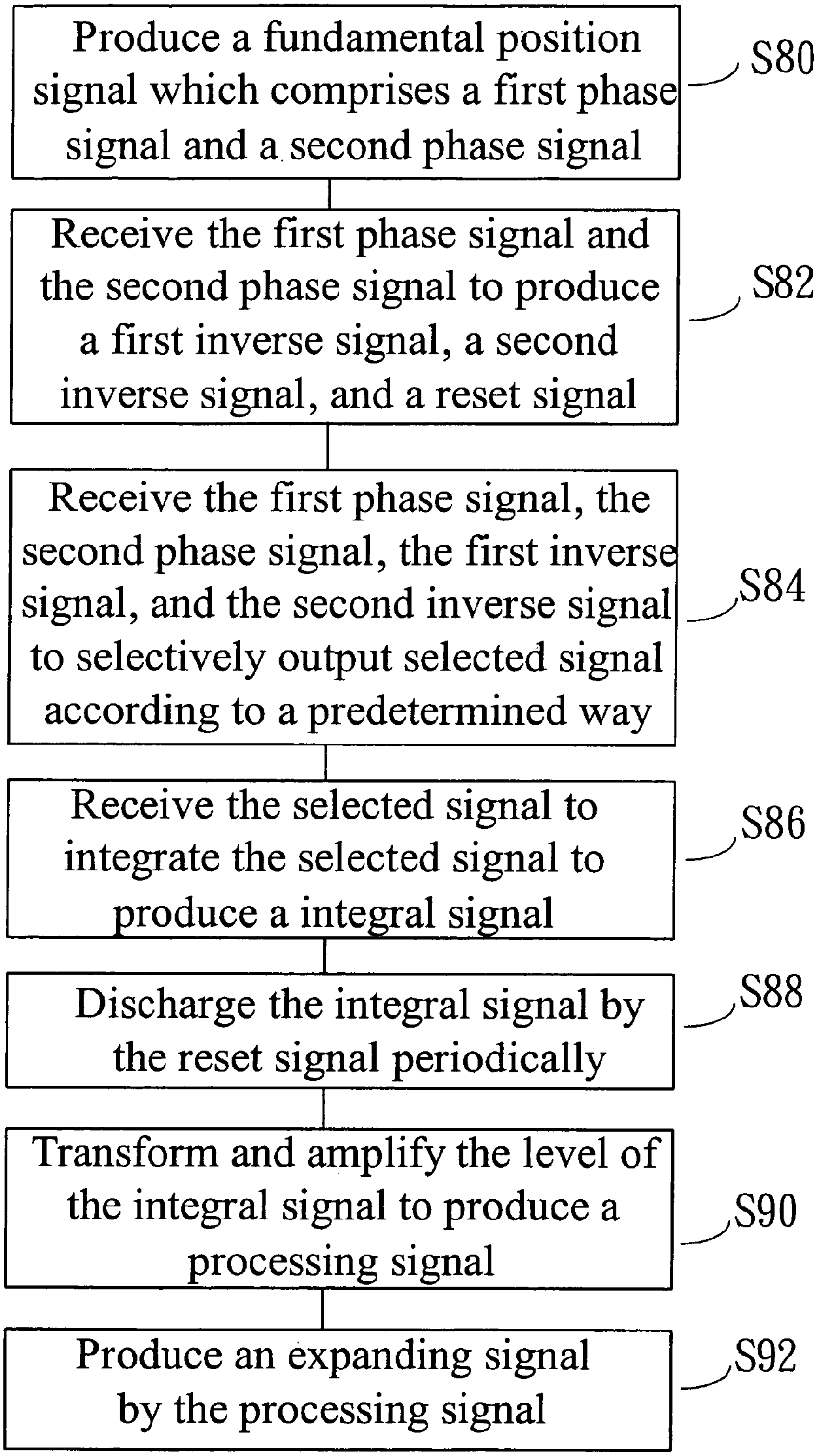
FIG. 5 is a flow chart of the steps of the method for enhancing the resolution of the digital encoder of the present invention.

Please refer to FIG. 5. FIG. 5 is a flow chart of the steps of the method for enhancing the resolution of the digital encoder in the present invention. The invention provides a method for enhancing the resolution of the digital encoder. Therefore, the digital encoder 12 of FIG. 2 will be utilized for description. As shown in FIG. 5, the method of enhancing the resolution of the digital encoder comprises the following steps:

S80: Produce a fundamental position signal 30 which comprises a first phase signal 32 and a second phase signal 34;

S82: Receive the first phase signal 32 and the second phase signal 34 to produce a first inverse signal 46, a second inverse signal 48, and a reset signal 38;

S84: Receive the first phase signal 32, the second phase signal 34, the first inverse signal 46, and the second inverse signal 48 to selectively output a selected signal 50 according to a predetermined way.

S86: Receive the selected signal 50 and integrate the selected signal 50 to produce an integral signal 36;

S88: Discharge the integral signal periodically by the reset signal 38;

S90: Transform and amplify the level of the integral signal to produce a processing signal 64;

S92: Produce an expanding signal 70 by the processing signal 64;

In the above mentioned steps S82 to S88, the invention produces the integral signal 36 according to the fundamental signal 30 and further discharges the integral signal 36 periodically; the integral signal 36 discharges when the reset signal 38 is at the first state. In step S86, the invention selectively outputs the selected signal 50 according to the predetermined way, which is similar to the above mentioned method in the integrated circuit 14 and will not be described in detail again.

In the device and method for enhancing the resolution of the digital encoder of the present invention, the resolution of the expanding position signal is higher than the resolution of the fundamental position signal. When the device which enhances the resolution of the digital encoder of the invention is applied to motor control, it controls the rotation of the motor in positions of bigger scale according to the fundamental position signal, while the invention controls the rotation of the motor in positions of smaller scale according to the expanding position signal. Compared to the prior art, the device and method of the present invention allow the resolution of the position signal outputted by the digital encoder to not be limited by the original design value. The original digital signal (the fundamental position signal) of the digital encoder is utilized to control the positions of bigger scale; moreover, it can use the digital signal with enhanced resolution (the expanding position signal) to control the positions of smaller scale. Therefore, the function of precise control of the motor is achieved. Furthermore, the invention does not need to use special control chips or complicated circuits.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A device for enhancing the resolution of a digital encoder which outputs a fundamental position signal, the device comprising:

a selected integral circuit receiving the fundamental position signal to produce an integral signal according to a predetermined way;

a reset circuit connected to the selected integral circuit and resetting the selected integral circuit according to the fundamental position signal;

a level shift and gain circuit connected to the selected integral circuit and processing the fundamental position signal to produce a processing signal; and an analog-digital converter receiving the processing signal to generate an expanding position signal, wherein the resolution of the expanding position signal is higher than the resolution of the fundamental position signal.

2. The device of claim 1, wherein the reset circuit comprises:

a pulse wave generator receiving the fundamental position signal to produce a reset signal; and a switch connected to the pulse wave generator and receiving the reset signal to reset the selected integral circuit.

3. The device of claim 2, wherein the switch is closed to discharge the integral signal for resetting the selected integral circuit if the reset signal is at a first state.

4. The device of claim 1, the fundamental position signal comprises a first phase signal and a second phase signal, wherein the phase difference between the first phase signal and the second phase signal is 90 degree.

5. The device of claim 4, wherein the selected integral circuit comprises:

an inverter receiving the first phase signal and the second phase signal to produce a first inverse signal and a second inverse signal;

a multiplexer receiving the first phase signal, the second phase signal, the first inverse signal, and the second inverse signal, the multiplexer selectively outputting a selected signal based on the predetermined way; and an inverse integrator receiving the selected signal to produce the integral signal.

6. The device of claim 5, wherein the selected signal is the first phase signal if the first phase signal is at the first state, and the second phase signal is at a second state or the selected signal is the second phase signal if both the first phase signal and the second phase signal are at the first state; or the selected signal is the first inverse signal if the first phase signal is at the second state and the second phase signal is at the first state; or the selected signal is the second inverse signal if both the first phase signal and the second phase signal are at the second state.

7. A method for enhancing the resolution of a digital encoder, wherein the method comprises the following steps:

(a) producing a fundamental position signal;

(b) according to a predetermined way, producing an integral signal based on the fundamental position signal, the integral signal being periodically discharged;

(c) producing a processing signal according to the integral signal; and (d) producing an expanding position signal according to the processing signal, wherein the resolution of the expanding position signal is higher than the resolution of the fundamental position signal.

8. The method for enhancing the resolution of the digital encoder of claim 7, the fundamental position signal comprising a first phase signal and a second phase signal, wherein the phase difference between the first and the second phase signal is 90 degree.

9. The method for enhancing the resolution of the digital encoder of claim 8, wherein step (b) comprises:

(b1) receiving the first and the second phase signal to produce a first inverse signal, a second inverse signal, and a reset signal;

(b2) receiving the first phase signal, the second phase signal, the first inverse signal, and the second inverse signal to selectively output a selected signal based on the predetermined way;

(b3) receiving and integrating the selected signal to produce the integral signal; and (b4) discharging the integral signal periodically according to the reset signal.

10. The method for enhancing the resolution of the digital encoder of claim 9, wherein the integral signal is discharged when the reset signal is at a first state.

11. The method for enhancing the resolution of the digital encoder of claim 8, wherein the selected signal is the first phase signal if the first phase signal is at the first state, and the second phase signal is at a second state; or the selected signal is the second phase signal if both the first phase signal and the second phase signal are at the first state; or the selected signal is the first inverse phase signal if the first phase signal is at the second state, and the second phase signal is at the first state; or the selected signal is the second inverse signal if both the first phase signal and the second phase signal are at the second state.

* * * * *